(12) United States Patent
Kravtchenko

(10) Patent No.: US 7,139,961 B2
(45) Date of Patent: Nov. 21, 2006

(54) METHOD AND APPARATUS FOR DECODING ERROR CORRECTION CODE

(75) Inventor: Alexander Kravtchenko, Villingen-Schwenningen (DE)

(73) Assignee: Thomson Licensing, Boulogne-Billancourt (FR)

( * ) Notice: Subject to any disclaimer, the term of this patent is extended or adjusted under 35 U.S.C. 154(b) by 199 days.

(21) Appl. No.: 10/468,322

(22) PCT Filed: Feb. 4, 2002

(86) PCT No.: PCT/EP02/01105

§ 371 (c)(1),
(2), (4) Date: Aug. 15, 2003

(87) PCT Pub. No.: WO02/069505

PCT Pub. Date: Sep. 6, 2002

(65) Prior Publication Data

US 2004/0088635 A1    May 6, 2004

(30) Foreign Application Priority Data

Feb. 16, 2001    (EP) .................................. 01103804

(51) Int. Cl.
  *H03M 13/00*    (2006.01)
(52) U.S. Cl. .................................................... 714/756
(58) Field of Classification Search ................ 714/752, 714/755–757
  See application file for complete search history.

(56) References Cited

U.S. PATENT DOCUMENTS

| | | | |
|---|---|---|---|
| 4,637,021 A | 1/1987 | Shenton | 714/756 |
| 4,845,714 A | 7/1989 | Zook | 714/755 |
| 5,627,844 A * | 5/1997 | Cho | 714/759 |
| 5,745,505 A * | 4/1998 | Yonemitsu et al. | 714/755 |

FOREIGN PATENT DOCUMENTS

| | | |
|---|---|---|
| EP | 0 278 383 | 8/1988 |
| EP | 0 782 138 | 7/1997 |
| WO | 99/48097 | 9/1999 |

OTHER PUBLICATIONS

Yamauchi et al., A 24-X-Speed CIRC decoder for a CD-DSP/CD-ROM decoder LSI, Jun. 13, 1997, IEEE, p. 483-490.*
Search Report *.

* cited by examiner

*Primary Examiner*—Shelly Chase
(74) *Attorney, Agent, or Firm*—Joseph J. Laks; Ronald H. Kurdyla

(57) ABSTRACT

CIRC (cross interleave Reed-Solomon code) cods decoding includes for each input frame a one-symbol delay operation of every second data symbol and the inversion of parity symbols, C1 word decoding, de-interleaving, C2 word decoding, and a two-symbol delay operation before output. The error correction capabilities can be improved if the C1 word decoding, de-interleaving and C2 word decoding are carried out twice (double pass operation) before the two symbol delay operation and output. The invention allows double pass operation as well as single pass operation and uses a single memory with minimum capacity, wherein to three parts of the memory specific operations are assigned and wherein the memory is controlled in a special way.

10 Claims, 8 Drawing Sheets

METHOD AND APPARATUS FOR DECODING ERROR CORRECTION CODE

This application claims the benefit under 35 U.S.C. §365 of International Application PCT/EP02/01105 filed Feb. 4, 2002, which claims the benefit of European Application No. 01103804.9 filed Feb. 16, 2001.

1. Field of the Invention

The invention relates to a method and to an apparatus for decoding CIRC (cross interleave Reed-Solomon code) error correction code, in particular a decoding with increased correction performance for burst errors or random errors in digital data read from an optical storage medium.

2. Background of the Invention

For example, an encoding process for CIRC code with a (28, 24) Reed-Solomon code (C2 code) is performed for twenty-four data symbols, with each symbol having a word length of eight bits. In typical audio applications each audio sample is represented by 16 bits. If above CIRC code is used for channel coding such digital audio signal, each sample can be represented by two 8-bit symbols. Thus each 8-bit symbol represents either the 8 MSBs or the 8 LSBs of one audio sample of one of the two channels of stereophonic audio data. These data symbols having a first state of arrangement are transformed to a second state of arrangement by an interleaving operation. The further encoding process of the (32, 28) Reed-Solomon code (C1 code word) is then executed for the 28 symbols that are now in the second arrangement state.

FIG. 1 shows circuitry for the conventional CIRC code decoding of such RS code. The main processing steps in such CIRC decoder are:
a) Delaying every second incoming data symbol by one symbol in a stage 1SYMDEL, wherein some of the delayed symbols become inverted;
b) Decoding the RS code C1 (32, 28, 5) in a stage C1DEC, thereby correcting erroneous symbols;
c) De-interleaving in a stage UNEQDEL;
d) Decoding the RS code C2 (28, 24, 5) in a stage C2DEC, thereby correcting erroneous symbols;
e) Delaying some of the C2 decoded data symbols by two symbols in a stage 2SYMDEL.

Every 32 incoming data symbols form one frame and are supplied to circuit 1SYMDEL, in which the even numbered symbols only are delayed by one data symbol period, i.e. an amount of one frame. The 32 symbols output from circuit 1SYMDEL are supplied to a C1 decoder C1DEC, wherein the actual decoding of the (32, 28, 5) Reed-Solomon code (C1 code word) is executed and wherein up to two erroneous symbols in a C1 code word are corrected. In case three or more errors are detected in the C1 decoder, the C1 pointer (i.e. an erasure flag) is set for all data symbols in the current C1 code word.

The data symbols and erasure flags are further processed in the de-interleaving stage UNEQDEL that includes delay lines of unequal length. The output of stage UNEQDEL is supplied to a C2 decoder C2DEC. In the de-interleave stage UNEQDEL the erasure flag of each data symbol generated from the C1 decoder is de-interleaved in a manner similar to the de-interleaving of the data. Up to four errors can be corrected in the C2 decoder, using said C1 erasure flag. If correction of up to four errors has been performed, the C1 erasure flags will be cleared. If there are more than four errors, either the C1 erasure flag is copied into the C2 code word, or an erasure flag is set for all symbols of a C2 code word. The last stage in the CIRC decoding is a two-symbol delay 2SYMDEL.

Various conventional methods for CIRC code decoding have been published, for example in EP-A-0 497 593, U.S. Pat. No. 4,476,562, U.S. Pat. No. 4,497,058, U.S. Pat. No. 4,546,474, U.S. Pat. No. 5,276,674 and EP-A-0 156 440. In these conventional decoding methods error processing is performed according to the so-called erasure correction method, in which the location of the error symbol is indicated by pointer information and the necessary correction is performed on this error symbol. In the case of above-mentioned C1 and C2 code word, detection and correction of up to double errors can be performed, and if the error location is already known, correction of up to four erasures or errors can be performed. Therefore, in order to increase the error correction capability, it is preferable to perform the erasure correction method when decoding the error. Furthermore, the erasure correction method has been found to be effective particularly in correcting burst errors.

The conventional decoding methods like that depicted in FIG. 1 can not double process blocks of the CIRC code, which would improve the error correction capabilities. To provide this additional feature one can either spend additional circuitry for a conventional CIRC decoder, or modify a conventional CIRC decoder.

In EP-A-0 278 383 a decoding method has been published that uses the conventional decoding method, i.e. a conventional CIRC decoder, but allows double processing of the CIRC code. In 'double processing', the C1 decoding and the C2 decoding are executed twice in a specific order: the C1 code word are supplied to a C1 decoder in which the actual decoding of the (32, 28) Reed-Solomon code is executed. Correction of up to two errors is possible. If three or more errors are detected in the C1 decoder, a C1 pointer is set for all symbols in the C1 code word. The corrected data and the C1 error pointers are further processed in a de-interleaving stage. The output of the de-interleaving stage is supplied to a C2 decoder in which erasure correction of up to four erasures is executed using the C1 pointer or pointers. Upon completion of the erasure correction in the C2 decoder, the C1 poin-ter/s is/are cleared and no pointer information is transferred to the second C2 decoding cycle. During the second cycle the data from the C2 decoder is supplied to an interleaver that returns the data in the original reproduction order. Thereafter starts the second decoding cycle, which repeats the first decoding cycle. Therefore the double processing of the CIRC code is achieved using an additional interleaving stage.

In U.S. Pat. No. 4,637,021 a decoding method is described that performs double processing of the CIRC code, but no single pass processing is possible. Error detection and correction are effected by the processing of blocks of data bytes, using a C1 decoder and a C2 decoder. In order to maximise the speed at which the data is processed, the C1 and C2 decoders operate concurrently on data stored in a system memory, wherein the C1 decoder operates on corresponding data prior to the C2 decoder. Error processing of up to double-error correction is executed in the first C1 decoding stage, and double-error correction is executed in the C2 decoding stage by referring to pointer information that is derived from the C1 decoding stage. The C1 pointer information is not used to increase the error correction capability of the error correction system but to check the quality of the decoding pro-cess.

The sequence of data bytes read by the C1 and C2 decoders from the system memory is as follows: The first C1 decoder processes a C1 block of data symbol bytes (32 bytes). The first C2 decoder then processes a C2 block of data bytes (28 bytes) that has been processed already by the C1 decoder. This concludes the first pass. A second C1 decoder processes data bytes that have been processed already by the first pass, and a second C2 decoder processes data bytes that have been processed already by the first pass and the second C1 decoder. This concludes the second pass. A decoder cycle comprises the execution of both, the first pass and the second pass. Upon termination of each decoder cycle, the address counter is incremented, and a further decoding cycle is carried out.

New data is written into the system memory immediately after data symbol (C1 block) input into the input buffer is ready. Thus, in operation, the reading of the four decoders continually advances through the system memory until all available data has been processed.

For the de-interleaver implementation and for data controlling a different method is used. The de-interleaver block is implemented into the memory. It has 256*32 bytes and consists of two blocks, a C1 block having 128*32 bytes and a C2 block having 128*32 bytes. The C1 block is addressed from row 112 to 239. The C2 block is addressed from row 240 to row 255 and then from row 0 to row 111. The memory is circular. The first C1 decoder processes a C1 block of 32 data bytes and is initially positioned for reading the C1 block at address 112. In each succeeding decoder cycle (i.e. execution of two passes by both, the C1 decoder and the C2 decoder) the C1 decoder is positioned for, and reads, the C1 block at the next successive higher address. Thus, for the second cycle the C1 block is positioned at memory address position 113. The first C2 decoder processes a C2 block of 28 data bytes and is initially positioned for reading the C2 block at memory address 0. The bytes comprising a C2 block lie along a diagonal line in the two-dimensional memory space. In successive decoding cycles the bytes comprising a C2 block are changed. The second C1 decoder is initially positioned for reading the C1 block at memory address 240 and the second C2 decoder is initially positioned for reading the C2 block at memory address 113. The executions of the four decoding passes do continually advance through the memory. As long as unprocessed data is still in memory, the decoding cycles will be continued. If all data in the memory has been corrected, the operation of the error correction system is completed.

SUMMARY OF THE INVENTION

However, CIRC code decoding according to the teaching given in U.S. Pat. No. 4,637,021 has some disadvantages:
a) The one-symbol delay operation and the inversion of parity symbols in a frame is performed using additional circuitry;
b) The two-symbol delay operation is performed using additional circuitry;
c) The memory requires 256 banks, each bank consisting of 32 bytes, with their associated erasure flag. Thus, the memory capacity is significantly higher than that of two CIRC blocks, of which each block comprises 109 banks only;
d) Single pass operation of the CIRC decoder is not possible.

A problem to be solved by the invention is to provide a CIRC code decoding that allows double pass operation as well as single pass operation, avoids unnecessary additional circuitry and requires a minimum memory capacity only. This problem is solved by the method disclosed in claim 1.

An apparatus that utilises this method is disclosed in claim 6.

The appropriately delayed C1 code words are supplied to a C1 decoder in which the actual decoding of the (32, 28) Reed-Solomon code is executed. Correction of up to two errors is possible. If three or more errors are detected in the C1 decoder, a C1 pointer is set for all symbols in the C1 code word. The corrected data and the C1 error pointers are further processed in a de-interleaving stage. The output of the de-interleaving stage is supplied to a C2 decoder, in which erasure correction of up to four erasures is executed using the C1 pointer or pointers. Thereafter starts, if desired, the second decoding cycle, which repeats above first decoding cycle. Thereby e.g. 28 preliminarily corrected output words of the first-pass C2 decoding stored in the memory, together with the e.g. four parity bits or words (or corresponding error correction bits) still stored in the memory, form the e.g. 32 input data symbols for the second-pass C1 decoding. Thereby 'double processing' of the CIRC code is achieved.

According to the invention, the one-symbol and the two-sym-bol delay operations of the CIRC code decoding and the avai-lability of double as well as single pass CIRC code decoding are achieved by a special controlling and addressing of the memory. Advantageously, no additional hardware is required, and a reduced capacity of the memory is sufficient.

For double pass decoding, all data bytes in the memory are corrected twice using a single decoder. For the de-interlea-ver implementation, a smaller memory size of 218*32 is used instead of 256*32 like in the above-mentioned decoding method (218 corresponds to the above mentioned two-fold CIRC block length). The invention uses the erasure correction method of the RS code. The correction of a large burst error of corrupted C1 code words is very effective in case of low input error rate, if each C1 code word contains up to 6 random errors.

In principle, the inventive method is suited for decoding error correction code, e.g. CIRC code, including the steps:
storing a current frame of coded data symbols including error correction bits into a first part of a memory;
writing said current frame of data symbols, thereby delaying part of the data symbols by one data symbol period, into a second part of said memory, these data symbols then representing a C1 code word;
reading said C1 code word from said memory, carrying out on said C1 code word a C1 decoding including a first error correction, and writing the corrected C1 code word into said second part of said memory;
reading said corrected C1 code word from said memory, carrying out on said corrected C1 code word a de-interleaving and a C2 decoding including a second error correction or an erasure correction;
storing the resulting corrected C2 code word into a third part of said memory;
reading said corrected C2 code word from said third part of said memory, delaying part of the code word data symbols by two data symbol periods, and writing the resulting corrected data symbols into said third part of said memory;
outputting the corrected data symbols of the current frame from said third part of said memory, or the steps:
storing a current frame of coded data symbols including error correction bits into a first part of a memory;
writing said current frame of data symbols, thereby delaying part of the data symbols by one data symbol period, into a second part of said memory, these data symbols then representing a C1 code word;

reading said C1 code word from said memory, carrying out on said C1 code word a preliminary C1 decoding including a first preliminary error correction, and writing the preliminarily corrected C1 code word into said second part of said memory;

reading said preliminarily corrected C1 code word from said memory, carrying out on said preliminarily corrected C1 code word a de-interleaving and a preliminary C2 decoding including a second preliminary error correction or a preliminary erasure correction, and writing the resulting preliminarily corrected C2 code word into said second part of said memory;

reading said preliminarily corrected C2 code word from said memory, carrying out on said preliminarily corrected C2 code word together with the required ones of said error correction bits a further C1 decoding including a first error correction, and writing the further corrected C1 code word into said second part of said memory;

reading said further corrected C1 code word from said memory, carrying out on said further corrected C1 code word a de-interleaving and a further C2 decoding including a second error correction or an erasure correction;

storing the resulting further corrected C2 code word into a third part of said memory;

reading said corrected C2 code word from said third part of said memory, delaying part of the code word data symbols by two data symbol periods, and writing the resulting corrected data symbols into said third part of said memory;

outputting the corrected data symbols of the current frame from said third part of said memory.

Advantageous additional embodiments of the inventive method are disclosed in the respective dependent claims.

In principle the inventive apparatus for decoding error correction code, e.g. CIRC code, includes:

an RS decoder;

a memory into a first part of which a current frame of coded data symbols including error correction bits is stored;

a controller controlling the writing of said current frame of data symbols, thereby delaying part of the data symbols by one data symbol period, into a second part of said memory, these data symbols then representing a C1 code word, wherein said controller further controls:

reading said C1 code word from said memory, carrying out in said RS decoder on said C1 code word a C1 decoding including a first error correction, and writing the corrected C1 code word into said second part of said memory;

reading said corrected C1 code word from said memory, carrying out on said corrected C1 code word a de-interleaving and in said RS decoder a C2 decoding including a second error correction or an erasure correction;

storing the resulting corrected C2 code word into a third part of said memory;

reading said corrected C2 code word from said third part of said memory, delaying part of the code word data symbols by two data symbol periods, and writing the resulting corrected data symbols into said third part of said memory;

means for outputting the corrected data symbols of the current frame from said third part of said memory, or includes:

a single RS decoder;

a memory into a first part of which a current frame of coded data symbols including error correction bits is stored;

a controller controlling the writing of said current frame of data symbols, thereby delaying part of the data symbols by one data symbol period, into a second part of said memory, these data symbols then representing a C1 code word, wherein said controller further controls:

reading said C1 code word from said memory, carrying out in said RS decoder on said C1 code word a preliminary C1 decoding including a first preliminary error correction, and writing the preliminarily corrected C1 code word into said second part of said memory;

reading said preliminarily corrected C1 code word from said memory, carrying out on said preliminarily corrected C1 code word a de-interleaving and in said RS decoder a preli-minary C2 decoding including a second preliminary error correction or a preliminary erasure correction, and writing the resulting preliminarily corrected C2 code word into said second part of said memory;

reading said preliminarily corrected C2 code word from said memory, carrying out in said RS decoder on said preli-minarily corrected C2 code word together with the required ones of said error correction bits a further C1 decoding including a first error correction, and writing the further corrected C1 code word into said second part of said memory;

reading said further corrected C1 code word from said memory, carrying out on said further corrected C1 code word a de-interleaving and in said RS decoder a further C2 decoding including a second error correction or an erasure correction;

storing the resulting corrected C2 code word into a third part of said memory;

reading said corrected C2 code word from said third part of said memory, delaying part of the code word data symbols by two data symbol periods, and writing the resulting corrected data symbols into said third part of said memory;

means for outputting the corrected data symbols of the current frame from said third part of said memory.

Advantageous additional embodiments of the inventive apparatus are disclosed in the respective dependent claims.

BRIEF DESCRIPTION OF THE DRAWINGS

Exemplary embodiments of the invention are described with reference to the accompanying drawings, which show in.

DETAILED DESCRIPTION

Figure 2:
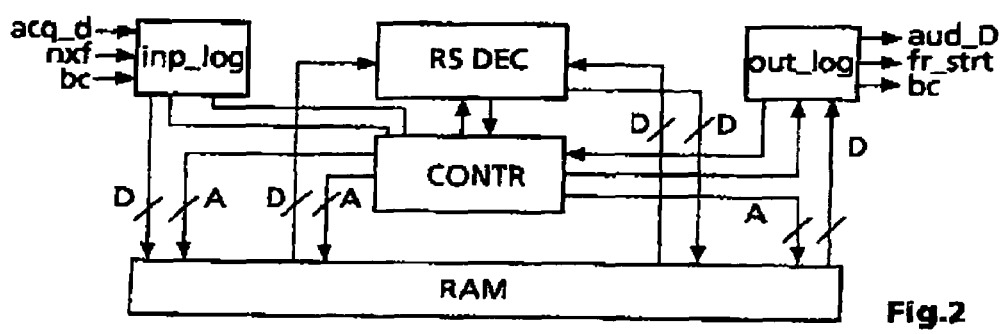
FIG. 2 block diagram of an inventive CIRC code decoder for double and single pass operation.

FIG. 2 shows the main components of the inventive CIRC code decoder, wherein D represents a data line or data bus and A represents an address line or address bus. Double and single pass operation is implemented in this architecture.

A data stream acq_d coming from an acquisition stage is stored into an input logic inp_log that is capable of storing 32 symbols. This input logic also receives a next-frame start signal nxf and a byte clock bc. If a sufficient amount of data is available in a buffer of the input logic, a complete frame is stored into a M1 part of a RAM memory. The decoder device includes a conventional RS decoder RSDEC wherein the above-mentioned erasure correction method for RS code is implemented. RSDEC is capable of correcting up to four erasures or up to two errors, or any combinations of errors and erasures according to the condition 2*t+E<d, wherein t is the number of errors in a code word and E is the number of erasures and d is the Hamming distance of the RS code, e.g. d=5 for audio compact disc applications.

Determining and addressing locations in the memory RAM, the transfer of data or data bytes to or from the RAM, the one-symbol and two-symbol delay operations, the de-interleaving operation, and read and write operations are performed using a controller CONTR. The memory RAM includes for instance 224 banks, each of which includes 32 bytes with their associated erasure flag. The memory includes three parts:

the M1 part (e.g. banks 218–220) is used for the one-sym-bol delay operation;

the M2 part (e.g. banks 0–217) is used for the de-interleaving operation;

the M3 part (e.g. banks 221–223) is used for the two-sym-bol delay operation.

RSDEC receives the required data from, and sends respective data to the corresponding parts of memory RAM. Following the above-described two-symbol delay operation, in each case 24 data bytes together with their associated erasure flags are loaded from the M3 part of memory RAM into an output logic out_log, that outputs the error corrected data aud_D and may also output a frame start information fr_strt and a byte clock bc.

Figure 3:
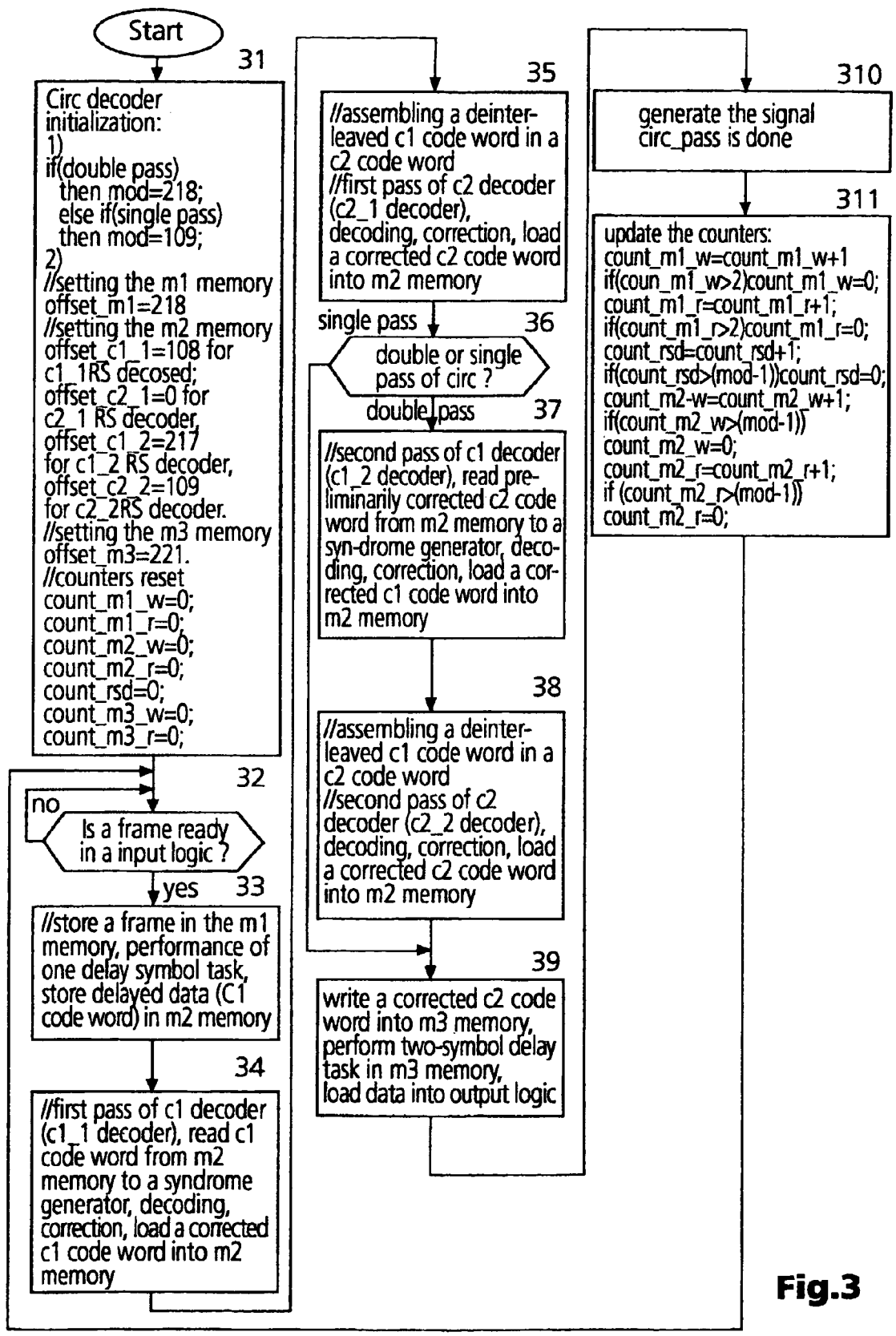
FIG. 3 flow chart for the CIRC code decoding, for double as well as single pass operation.

As shown in FIG. 3, the first operations in the CIRC decoder in flow block 31 are the initialisation of controller CONTR, the setting of memory RAM for double pass or single pass operation, and the reset of counters. Banks 0–217 of the M2 memory are used for double pass and banks 108–217 for single pass operation of the CIRC decoder. Two passes of C1 decoding and two passes of C2 decoding are executed in the double pass mode, and one pass of C1 decoding and one pass of C2 decoding in the single pass mode. In double pass operation, the c1_1 decoding ("_1" denotes the first pass) has its start position in bank 108, the c2_1 decoding has its start position in bank 0, the c1_2 decoding ("_2" denotes the second pass) has its start position in bank 217, the c2_2 decoding has its start position in bank 109. In single pass operation, the c1_1 decoding and the c2_1 decoding have their start positions at bank 108 and bank 0, respectively.

If a sufficient amount of data is available in the buffer of the input logic, a frame is stored into bank 218 of the M1 memory and the one-symbol delay operation is executed is as stated in step 32 and flow block 33.

Figure 4:
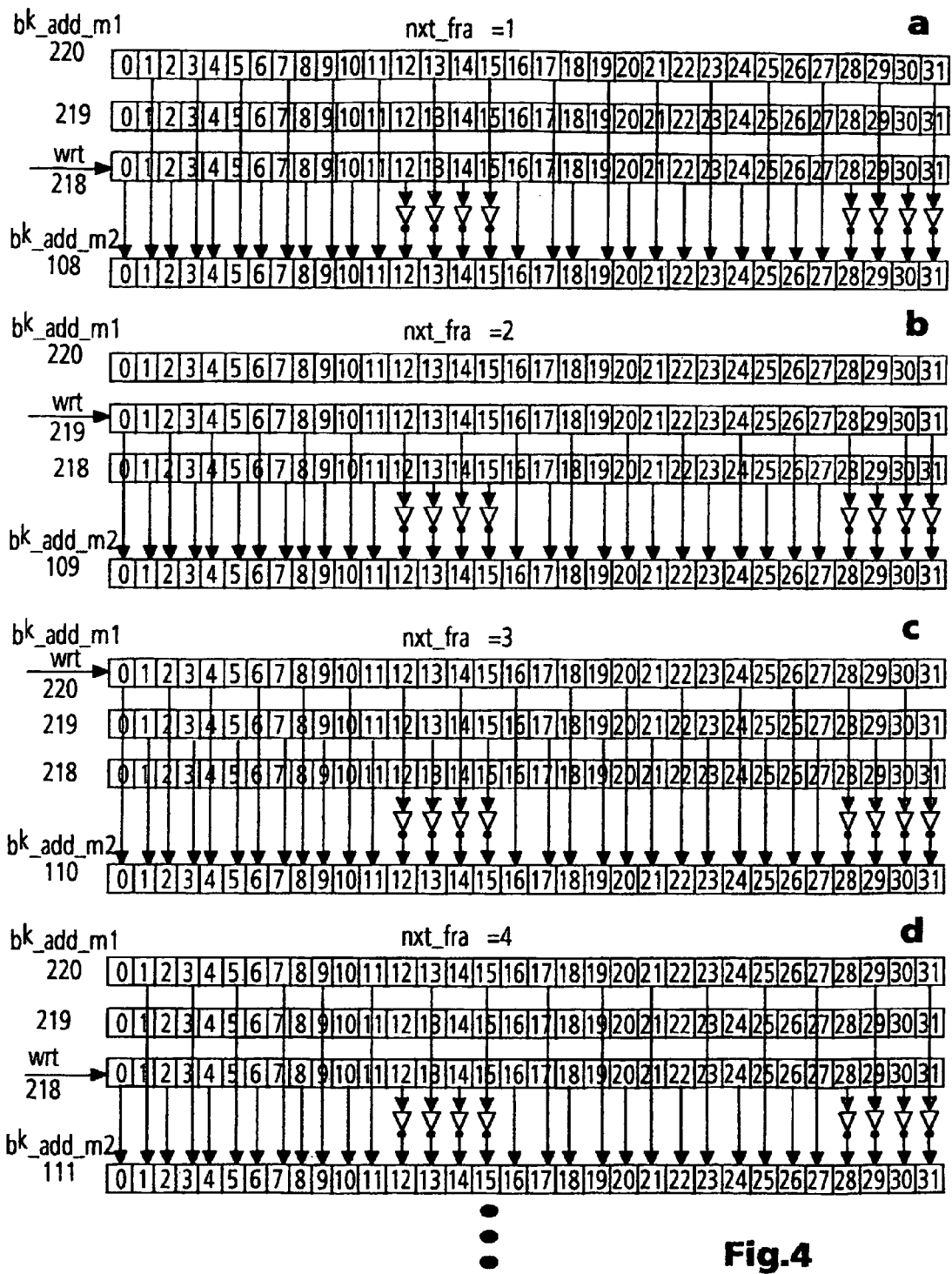
FIG. 4 one-symbol delay data flow in the M1 memory that is part of the RAM in FIG. 2.

As mentioned above, a frame of 32 symbols from the input logic inp_log is loaded into a corresponding bank (bank address bk_add_m1 218 in FIGS. 4a and 4c, 219 in FIG. 4b and 220 in FIG. 4c) of the M1 memory as depicted in FIG. 4. The arrow 'wrt' points in a rotating manner to that one of the bank addresses 218 to 220 into which the data are currently to be written.

Figure 5:
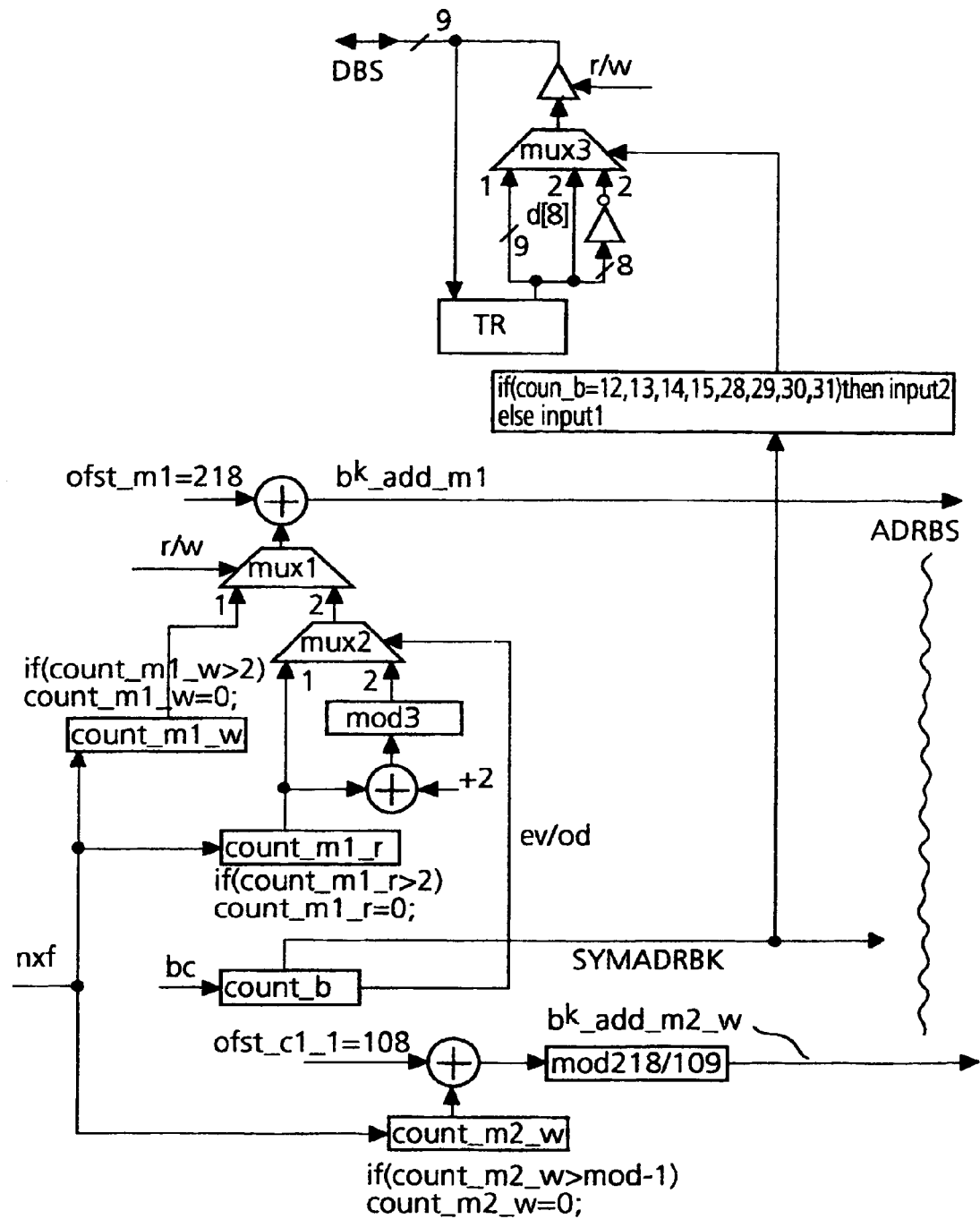
FIG. 5 circuitry for calculating address values for the M1 memory.

FIG. 5 shows the calculation of the address values bk_add_m1 for the M1 memory part, and the basic address calculation for the M2 memory. The current M1 bank write address is calculated according to the formula $$bk\_add\_m1\_w = ofst\_m1 + count\_m1\_w,$$

wherein the value count_m1_w stems from a write address counter count_m1_w and defines the M1 memory bank address for writing and ofst_m1 is a fixed offset having a value of '218'. If count_m1_w>2, counter count_m1_w is reset to zero.

A counter count_b has three outputs (one is not depicted in FIG. 5) and outputs the symbol address SYMADRBK in a bank, and an even or odd symbol ev/od for the M1 memory. This counter is normally clocked by the byte clock bc.

The M1 bank read addresses for the M1 memory depend on the value '0' or '1' of the even or odd symbol ev/od and are calculated according to the formulas:

$$bk\_add\_m1\_r\_0 = ofst\_m1 + count\_m1\_r$$

even $$bk\_add\_m1\_r1 = ofst\_m1 + (count\_m1\_r + 2) \bmod 3,$$

odd wherein the value count_m1_r stems from a read address counter count_m1_r. If count_m1_r>2, counter count_m1_r is reset to zero. If ev/od is '1', i.e. odd, to the original counter value count_m1_r the value '2' is added, and that result passes a modulo-3-circuit 'mod3' before being added to ofst_m1.

Figure 1:
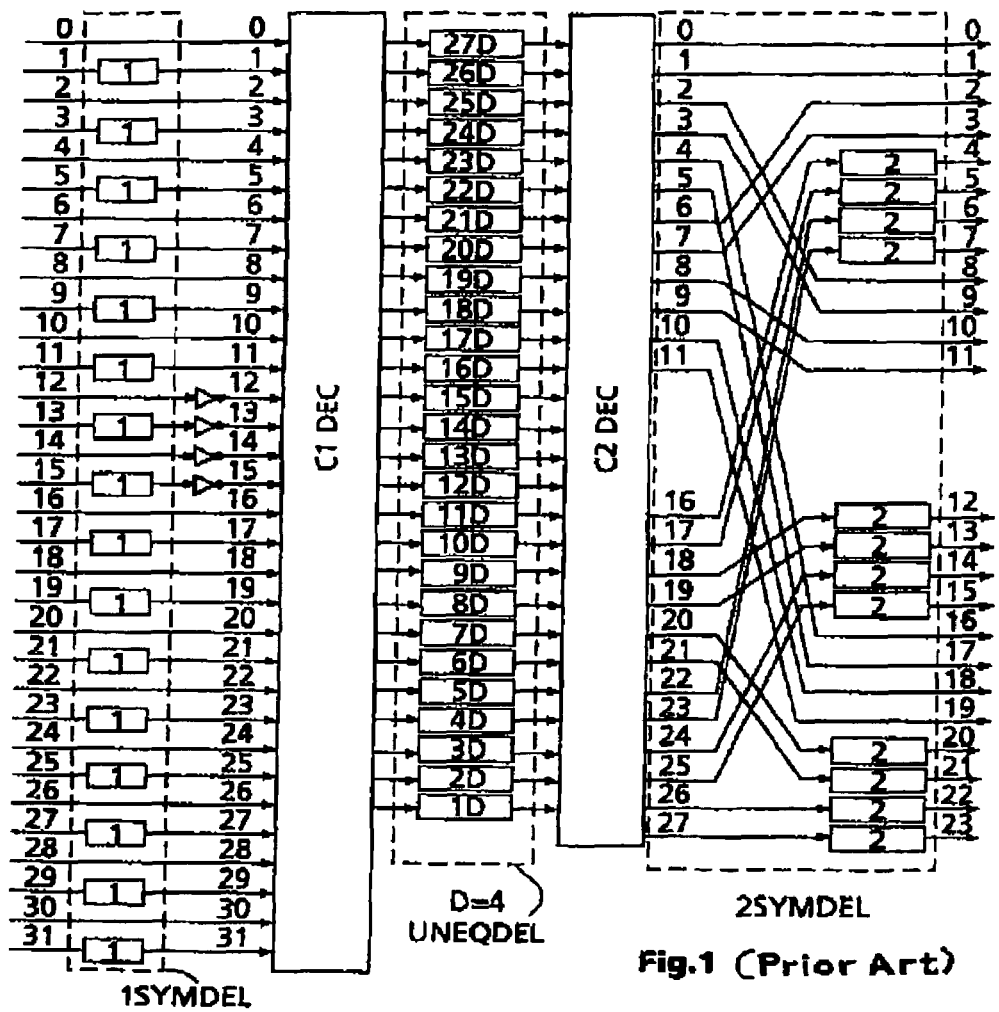
FIG. 1 functional block diagram of a conventional CIRC code decoder.

A symbol from the M1 memory is loaded into a temporal register TR. One byte of this symbol becomes inverted, except in case the output value SYMADRBK of counter count_b has a value of 12, 13, 14, 15, 28, 29, 30, or 31, cf. FIG. 1 C1DEC input. The correspondingly adapted count_b value is written via the tri-state data bus DBS into a bank of the M2 memory.

Delayed symbols are stored into the corresponding bank of the M2 memory, whereby e.g. '108' is the start position in the M2 memory.

The M2 bank write address bk_add_m2_w is calculated according to the formula:

$$bk\_add\_m2\_w = (ofst\_c1\_1 + count\_m2\_w) \bmod 218/109,$$

wherein ofst_c1_1 is an offset value according to the M2 start area in the memory that changes as described below, count_m2_w is the output value of a counter count_m2_w, and 'mod 218/109' denotes here and in the following 'mod 218' in case of double pass operation and 'mod 109' in case of single pass operation, and is the function of a corresponding modulo circuit. If count_m2_w>mod (218/109−1), counter count_m2_w is reset to zero.

The different address values bk_add_m1, bk add_m2_w and SYMADRBK are output via an address bus ADRBS at different time periods. Address values bk_add_m1 and SYMADRBK represent two parts of a common address value.

The counters count_m1_w, count_m1_r and count_m2_w are clocked by next-frame signal nxf. Counter count_b is clocked by the byte clock bc and counts from 0 to 31. The data flow in the M1 memory is repeated after three nxf signals, i.e. FIG. 4a and FIG. 4d are identical with respect to the M1 part.

The first pass operation of the C1 decoder is executed (see block 34 in FIG. 3) after a one-symbol delay operation. A C1 code word is read from the M2 memory to the syndrome generator of the RS decoder. Decoding and correction of a C1 code word is performed and a corrected code word is stored into the M2 memory.

The C1 bank address during the read and write operations is calculated according to the formula:

$$bk\_add\_c1\_fp = (ofst\_c1\_1 + count\_rsd) \bmod 218/109,$$

wherein ofst_c1_1 has a fixed value of 108 and the output value of a process counter count_rsd (not depicted in FIG. 5) defines the number of a process in the CIRC decoder.

The double pass operation of the of CIRC decoder includes the following steps, wherein each of the steps increments the process counter:
a) c1_1 decoding, correction;
b) de-interleaving for c2_1 decoder;
c) c2_1 decoding, correction;
d) c1_2 decoding, correction;
e) de-interleaving for c2_2 decoder;
f) c2_2 decoding, correction.

Each data symbol of the incoming CIRC encoded data is handled two times.

The single pass operation of the CIRC decoder includes the following steps:
a) c1_1 decoding, correction;
b) de-interleaving for c2_1 decoder;
c) c2_1 decoding, correction.

Figure 6:
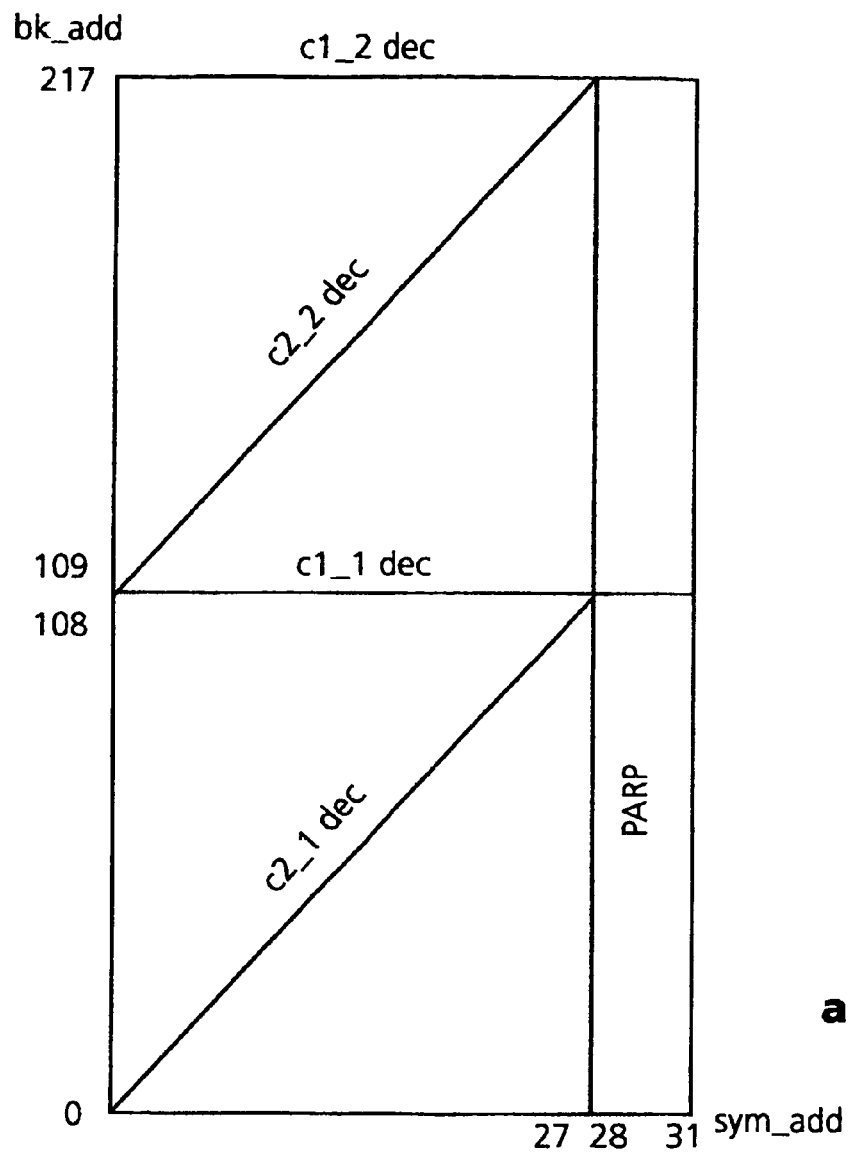
FIG. 6 memory M2, that is part of the RAM in FIG. 2, and the start positions of the c2_1 and c2_2 decoders and the assembling of a C2 code word from different banks of the M2 memory.

The size of the M2 memory is 218*32*9. M2 has two halves. FIG. 6a depicts the start positions of the c1_1, c1_2, c2_1 and c2_2 decoders in memory M2, and the assembling of a C2 code word from different banks of the M2 memory. The vertical position represents the memory bank address bk_add running from 0 to 217, and the horizontal position represents the symbol address sym_add running from 0 to 31. From symbol address 28 to 31 the parity part PARP of the C1 code words is arranged. The bank address offset values ofst_c1_1, ofst_c1_2, ofst_c2_1 and ofst_c2_2 for above processing steps are 108, 217, 0 and 109, respectively, and represent the start positions in the memory for a new frame.

New data is loaded from the M1 memory into banks 108 to 217 of the M2 memory (part 1) and handled by the c1_1 and c2_1 decoders. If the 109 banks have been used already by the c1_1 decoder, it continues with bank 0. The c1_2 and c2_2 decoders handle old data in part 2 of the M2 memory.

As an alternative, the start positions 108 and 217, and 0 and 109 can be exchanged, i.e. the four processing sequences can start in the other memory half instead.

In the first pass, in each succeeding decoder cycle a corrected C1 word from the C1 decoder is written at the same bank address. The next C1 word from the M1 memory is written into the next successively higher bank address of the M2 memory. For example:
a) Write the C1 code word from the M1 memory into bank address #108 of the M2 memory;
b) Read this C1 code word from bank address #108 of the M2 memory and load it into the C1 decoder;
c) Write the corrected C1 code word from the C1 decoder into bank address #108 of the M2 memory;
d) Write the C1 code word from the M1 memory into bank address #109 of the M2 memory;
e) Read this C1 code word from bank address #109 of the M2 memory and load it into the C1 decoder;
f) Write the corrected C1 code word from the C1 decoder into bank address #109 of the M2 memory, and so on.

In the second pass, in each succeeding decoder cycle the input for the C1 decoder is read from the next successively higher memory bank address. The corrected C1 code word is loaded into that same memory bank address. The symbols of a C2 code words lie along a diagonal line in the M2 memory space. In successive decoding cycles, the data symbols representing a C2 code word are changed. The initial data symbol for writing a C2 code word is at memory bank address 0 and at data symbol address 0. After the first pass, a corrected C2 code word is loaded into the same position (memory bank address, data symbol address). After the second pass, a corrected C2 code word is loaded into the M3 memory.

Figure 7:
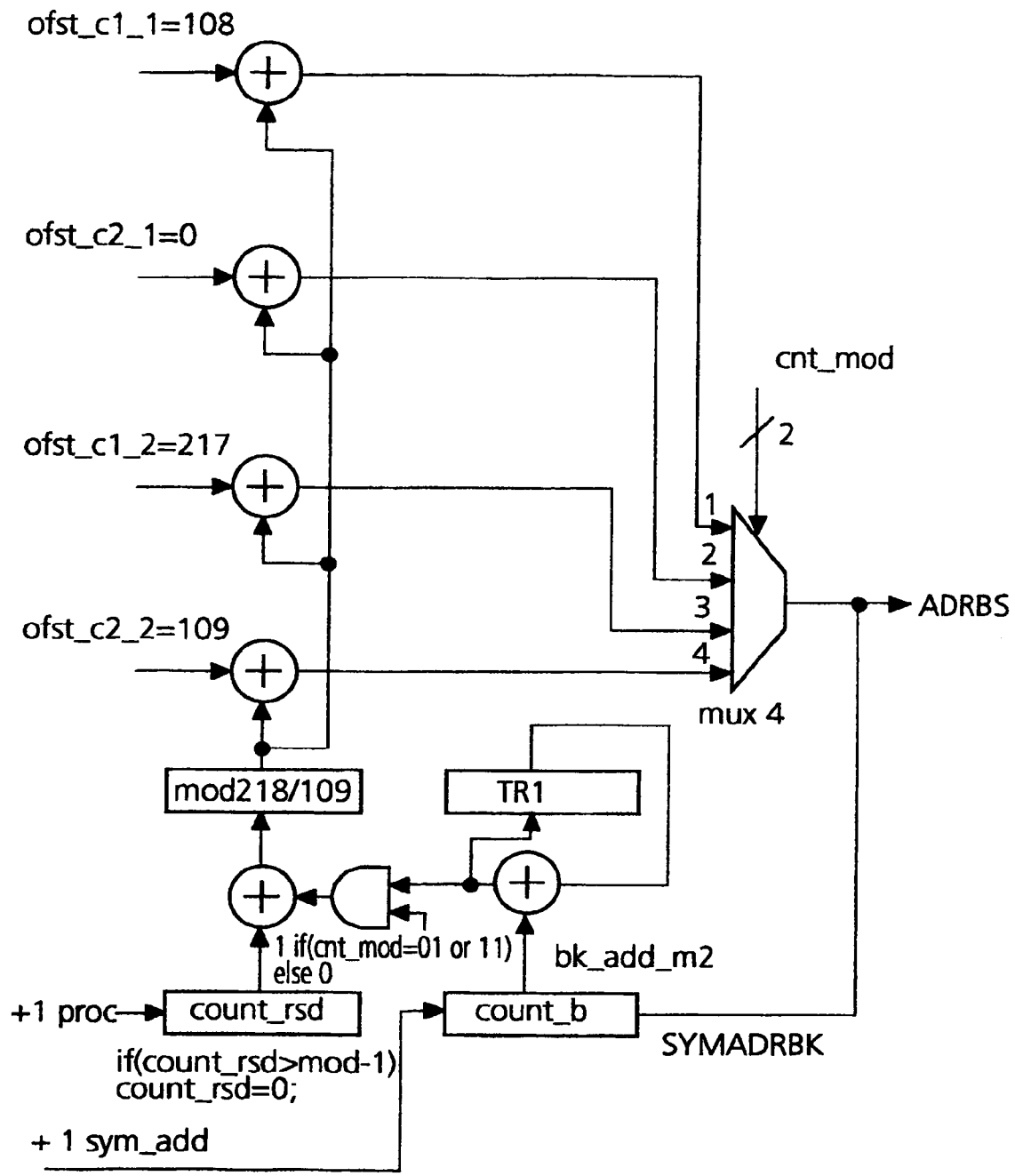
FIG. 7 circuitry for calculating address values for the M2 memory.

FIG. 7 illustrates in detail the calculation of address values for the M2 memory part. Advantageously, counter count_b can be used for different counting purposes and defines a symbol address in the current bank. A count mode signal cnt_mod coming from controller CONTR in FIG. 2 defines the current pass of the RS decoder and the corresponding count mode of counter count_b:
a) count_mode=00 C1 decoder, first pass;
b) count_mode=01 C2 decoder, first pass;
c) count_mode=10 C1 decoder, second pass;
d) count_mode=11 C2 decoder, second pass.

During the C1 processing count_b runs from zero up to 32, whereas during the C2 processing count_b runs from zero up to 28. During these time periods counter count_b is not clocked by the byte clock bc, but by the increment +1sym_add of the symbol address.

A multiplexer mux4 having four inputs selects a bank address bk_add_c1_fp at input 1 upon cnt_mod =00 (fp means first pass). A de-interleaved C1 code word is transformed into a C2 code word, and the first pass of the C2 decoder is executed (block 35 in FIG. 3). A C2 code word is written into the syndrome generator of the RS decoder. Decoding and correction of the C2 code word is performed and a corrected code word is stored into the M2 memory.

FIG. 6b depicts the assembling of a C2 code word from different banks of the M2 memory. The first line shows bank address numbers and the second line the corresponding symbol address numbers in the memory bank. The 28 bank addresses required during the read/write operations are calculated according to the formula:

$$bk\_add\_c2\_fp = (ofst\_c2\_1 + count\_rsd + 4*count\_b) \bmod 218/109,$$

wherein count_b defines the symbol address in the current bank address.

Multiplexer mux4 selects a bank address bk_add_c2_fp at input 2 upon cnt_mod=01. The second pass of the C1 decoder, or the C2 decoder is executed, depending on double pass operation mode of the CIRC decoder (c2_1 decoder, block 37 in FIG. 3) being switched on or off. A C1 code word is read from the M2 memory and loaded into the syndrome generator of RS decoder. Decoding and correction of a C1 code word is performed and a corrected code word is stored into the M2 memory. The bank address during the read/write operations is calculated according to the formula:

$$bk\_add\_c1\_sp = (ofst\_c1\_2 + count\_rsd) \bmod 218/109.$$

Multiplexer mux4 selects a bank address bk_add_c1_sp at input 3 upon cnt_mod=10 (sp means second pass). A deinterleaved C1 code word is transformed into a C2 code word, and the second pass of the C2 decoder is executed (c2_1 decoder, block 38 in FIG. 3). A C2 code word is written into the syndrome generator of the RS decoder. Decoding and correction of a C2 code word is performed, and a corrected code word is stored into the M2 memory. The 28 bank addresses required during the read/write operations are calculated according to the formula:

$$bk\_add\_c2\_sp = (ofst\_c2\_2 + count\_rsd + 4*count\_b) \bmod 218/109$$

Multiplexer mux4 selects a bank address bk_add_c2_sp at input 4 upon cnt_mod=11. A C2 code word is also stored into the m3 memory depend on double or single pass of CIRC deco-der. The following rules in 'C' notation describe the read/ write addressing in the M2 and M3 memories.

```
If(single pass) {
    for(count_b=0; count_b<28; ++count_b) {
        bk_add_c2_fp = (ofst_c2_1 + count_rsd + 4 times accumu-
                                                 lated count_b) mod
109;
        M3[ofst_m3] [count_b] = M2[bk + add_c2_fp] [count_b];
    }
} else if(double pass) {
    for(count_b=0; count_b<28; ++count_b) {
        bk_add_c2_sp = (ofst_c2_2 + count_rsd + 4 times accumu-
                                                 lated count_b) mod
218;
        M3[ofst_m3] [count_b] = M2[bk + add_c2_sp] [count_b];
    }
}
```

Instead of multiplying count_b by factor 4, the current value count_b is accumulated four times in order to save a multiplier.

The counter count_rsd is clocked by a next-process signal +1proc. In single pass operation the counter is reset if count_rsd >mod 108, whereas in double pass operation the counter is reset if count_rsd >mod 217.

A first output of counter count_b delivers the symbol address SYMADRBK in a bank. SYMADRBK is transferred together with the output of mux4 via address bus ADRBS. A further output signal bk_add_m2 of this counter, stating the bank address in M2, is combined in an adder with a delayed output signal of this adder, which output signal for the purpose of delaying is intermediately stored in a temporal register TR1. The adder output signal passes through an AND gate to a further adder that receives the output signal of count_rsd as its second input signal. The second input of the AND gate receives logic value '1' if count_rsd has the value '01' or '11', else logic value '0'.

The output signal of the further adder passes through a mod 218/109 stage to the first input of four adders. The first one of these four adders receives at its second input an offset value ofst_c1_1=108, and provides its output signal to input 1 of mux4. The second, third and fourth one of these four adders receives at its second input an offset value ofst_c2_1=0, ofst_c1_2=217, ofst_c2_2=109, respectively, and provides its output signal to input 2, 3, or 4 of mux4, respectively.

If performing the double pass operation of the CIRC decoder, the two-symbol delay operation (block 39 in FIG. 3) is performed after the second pass operation of the C2 decoder.

If performing the single pass operation of the CIRC decoder, the two-symbol delay operation (block 39 in FIG. 3) is performed after the first pass operation of the C2 decoder.

Figure 8:
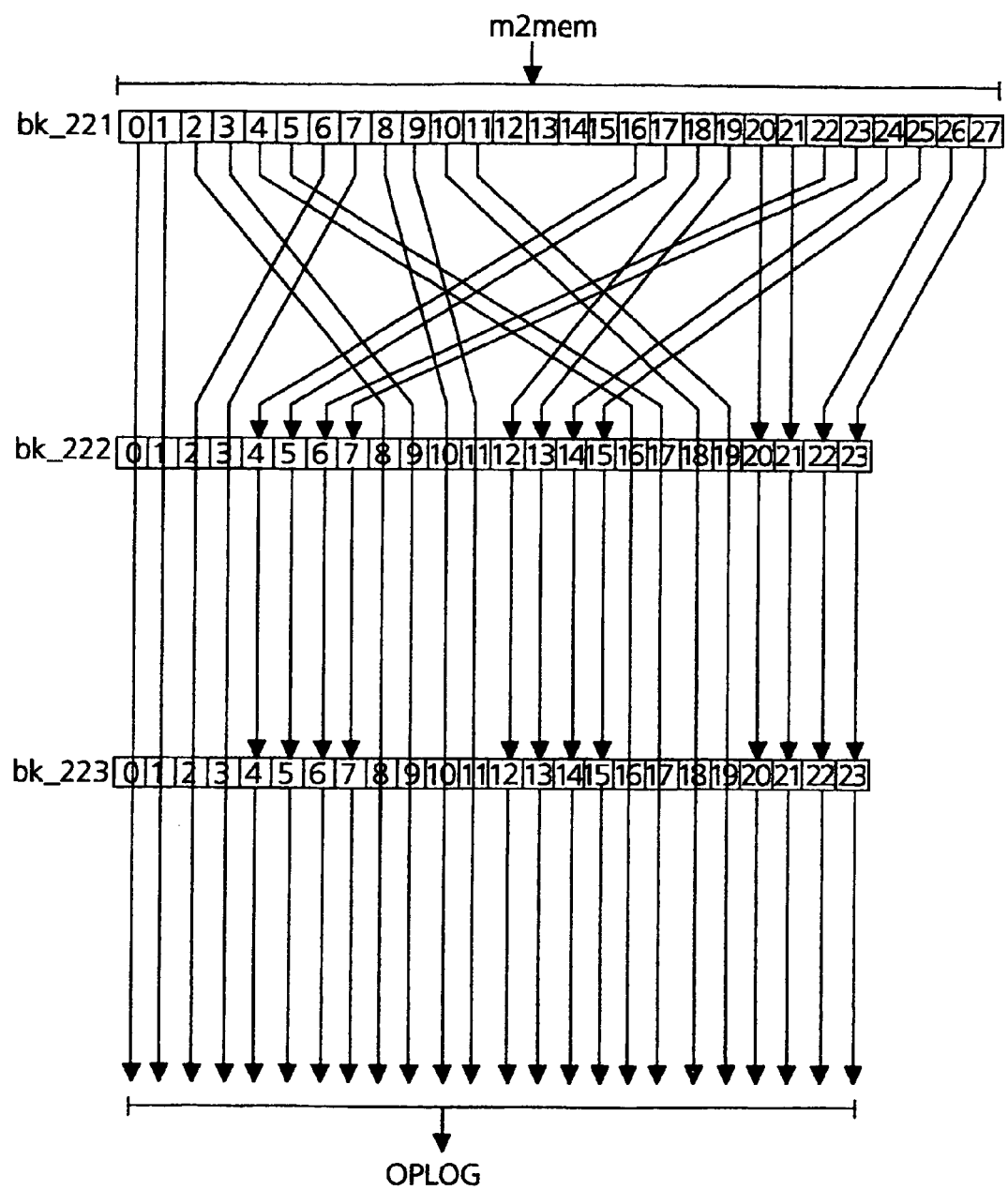
FIG. 8 data flow in the M3 memory during the two-symbol delay operation in the CIRC code decoding.

FIG. 8 illustrates the data flow within the M3 memory part during the two-symbol delay operation in the CIRC decoder, wherein the M3 memory includes three banks: bk_221, bk_222 and bk_223. After C2 decoding and correction, data m2mem from the M2 memory is loaded into bank bk_221. The two-sym-bol delay task includes two steps:

a) Reading the delayed data and transferring it to the output logic out_log;
b) Overwriting the M3 memory.

The following first table can be used to generate the addresses during the first step.

| count_b | 0 | 1 | 2 | 3 | 4 | 5 | 6 | 7 | 8 | 9 | 10 | 11 |
|---|---|---|---|---|---|---|---|---|---|---|---|---|
| bank | 221 | 221 | 221 | 221 | 223 | 223 | 223 | 223 | 221 | 221 | 221 | 221 |
| sym add | 0 | 1 | 6 | 7 | 4 | 5 | 6 | 7 | 2 | 3 | 8 | 9 |

| count_b | 12 | 13 | 14 | 15 | 16 | 17 | 18 | 19 | 20 | 21 | 22 | 23 |
|---|---|---|---|---|---|---|---|---|---|---|---|---|
| bank | 223 | 223 | 223 | 223 | 221 | 221 | 221 | 221 | 223 | 223 | 223 | 223 |
| sym add | 12 | 13 | 14 | 15 | 4 | 5 | 10 | 11 | 20 | 21 | 22 | 23 |

In this table are:
a) 'count_b' -> count value of the counter;
b) 'bank' -> bank_address 'bk' in the RAM;
c) 'sym_add' -> symbol address in a bank.

The following second table can be used to generate the read/ write addresses during the second pass or step. 'bank_r' is the bank_address 'bk' in the RAM for reading, whereas 'bank_w' is the bank_address 'bk' in the RAM for writing.

| count_b | 0   | 1   | 2   | 3   | 4   | 5   | 6   | 7   | 8   | 9   | 10  | 11  |
|---------|-----|-----|-----|-----|-----|-----|-----|-----|-----|-----|-----|-----|
| bank_r  | 222 | 222 | 222 | 222 | 221 | 221 | 221 | 221 | 222 | 222 | 222 | 222 |
| sym_add | 4   | 5   | 6   | 7   | 16  | 17  | 22  | 23  | 12  | 13  | 14  | 15  |
| bank_w  | 223 | 223 | 223 | 223 | 222 | 222 | 222 | 222 | 223 | 223 | 223 | 223 |
| sym_add | 4   | 5   | 6   | 7   | 4   | 5   | 6   | 7   | 12  | 13  | 14  | 15  |
| count_b | 12  | 13  | 14  | 15  | 16  | 17  | 18  | 19  | 20  | 21  | 22  | 23  |
| bank_r  | 221 | 221 | 221 | 221 | 222 | 222 | 222 | 222 | 221 | 221 | 221 | 221 |
| sym_add | 18  | 19  | 24  | 25  | 20  | 21  | 22  | 23  | 20  | 21  | 26  | 27  |
| bank_w  | 222 | 222 | 222 | 222 | 223 | 223 | 223 | 223 | 222 | 222 | 222 | 222 |
| sym_add | 12  | 13  | 14  | 15  | 20  | 21  | 22  | 23  | 20  | 21  | 22  | 23  |

Output data OPLOG from 'bk_223' are provided to output logic 'out_log'. The counters of controller CONTR are updated following step 39 of the flow diagram in FIG. 3, and the CIRC decoder is then ready to process the next frame coming from the input logic.

Figure 9:
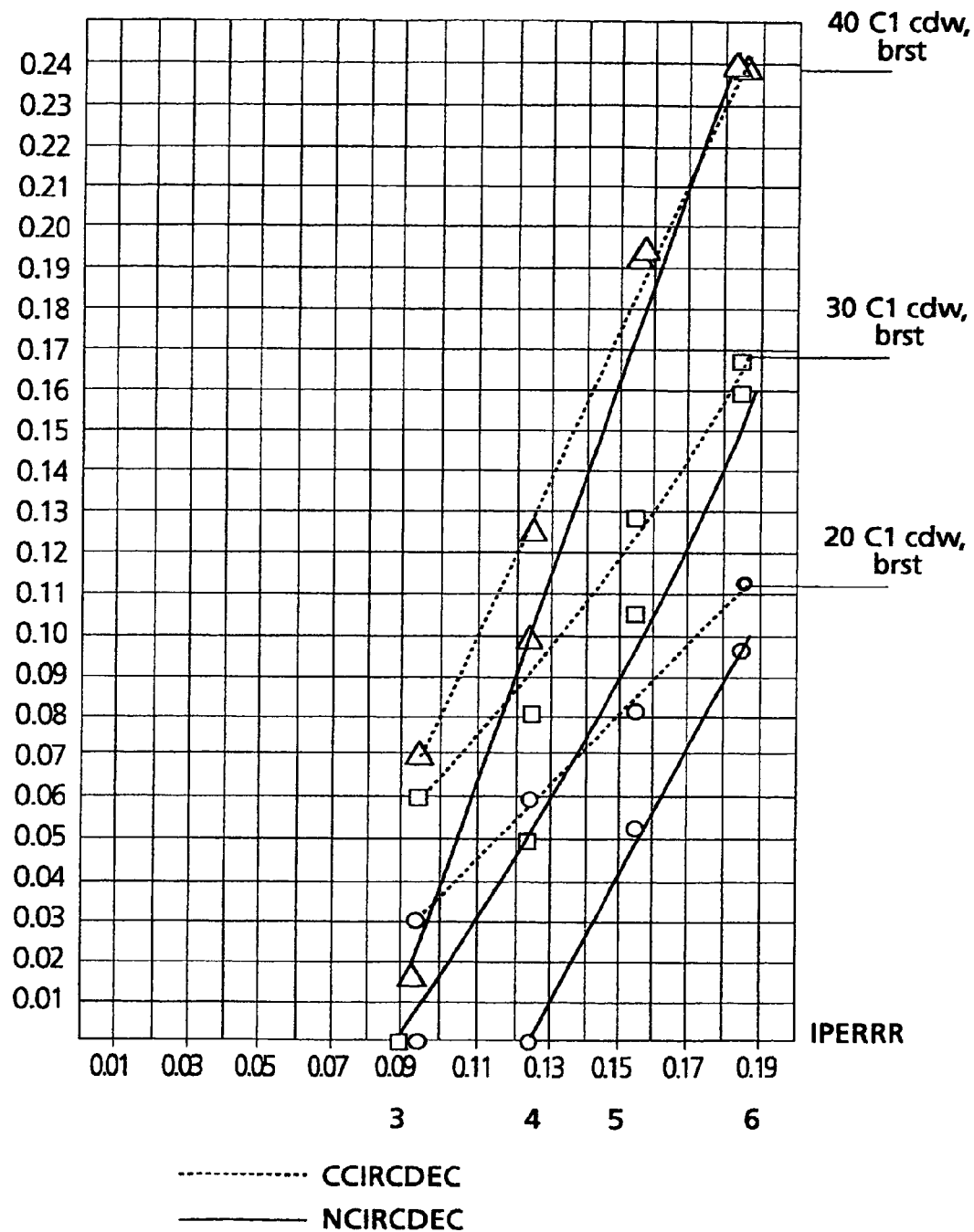
FIG. 9 correction results for a conventional and for the inventive CIRC code decoding.

The flagged bytes rate FLGBR vs. input error rate IPERRR results of a conventional and of the inventive double pass CIRC decoder are depicted in FIG. 9. The correction results of a conventional CIRC decoder CCIRC-DEC are shown by solid lines, and the correction results of the inventive CIRC decoder NCIRCDEC by dashed lines. Each curve is constructed from four different input error rate measurements. The following error combinations were input for the correction:

a) Burst 'brst' error of 20 C1 code words 'cdw' having 3 errors in each C1 code word.

Here, and in the following error patterns, the "errors in each C1 code word" are random errors.

b) Burst error of 20 C1 code words having 4 errors in each C1 code word.
c) Burst error of 20 C1 code words having 5 errors in each C1 code word.
d) Burst error of 20 C1 code words having 6 errors in each C1 code word.
e) Burst error of 30 C1 code words having 3 errors in each C1 code word.
f) Burst error of 30 C1 code words having 4 errors in each C1 code word.
g) Burst error of 30 C1 code words having 5 errors in each C1 code word.
h) Burst error of 30 C1 code words having 6 errors in each C1 code word.
i) Burst error of 40 C1 code words having 3 errors in each C1 code word.
j) Burst error of 40 C1 code words having 4 errors in each C1 code word.
k) Burst error of 40 C1 code words having 5 errors in each C1 code word.
l) Burst error of 40 C1 code words having 6 errors in each C1 code word.

The inventive CIRC decoder and a conventional CIRC decoder can correct burst errors of 14 completely corrupted C1 code words.

It is apparent that, compared with a conventional CIRC decoder, the inventive CIRC decoder is able to correct burst errors of 20 C1 code words having 3 or 4 errors in each code word. In case each code word having 5 and 6 errors, the decoder is not able to correct the burst error, but the flagged byte rate FLGBR of the audio data is still significantly lower than with a conventional CIRC decoder. Better correcting performance is also obtained with '30 C1 code word' burst errors. The inventive CIRC decoder is able to correct burst errors of 30 C1 code words having three errors in each code word, and the flagged byte rate FLGBR is also lower for higher error numbers per code word.

The invention can be also be applied to other digital storage media like Video CD and CD-ROM, and to the decoding of code similar to CIRC code.

The invention claimed is:

1. Method for decoding error correction code, e.g. CIRC code, characterised by the steps:
storing a current frame of coded data symbols including error correction bits into a first part of a memory;
writing said current frame of data symbols, thereby delaying part of the data symbols by one data symbol period, into a second part of said memory, these data symbols then representing a C1 code word;
reading said C1 code word from said memory, carrying out on said C1 code word a C1 decoding including a first error correction, and writing the corrected C1 code word into said second part of said memory;
reading said corrected C1 code word from said memory, carrying out on said corrected C1 code word a de-interleaving and a C2 decoding including a second error correction or an erasure correction;
storing the resulting corrected C2 code word into a third part of said memory;
reading (39) said corrected C2 code word from said third part of said memory, delaying part of the data symbols representing said corrected C2 code word by two data symbol periods, and writing the resulting corrected data symbols into said third part (M3) of said memory;
outputting the corrected data symbols of the current frame from said third part of said memory.

2. Method according to claim 1, wherein said first part of a said memory consists of a first number—e.g. three—of banks into which banks each succeeding frame of data symbols is written in a rotational manner.

3. Method according to claim 1, wherein said second part of said memory consists of a second number of banks, which number is twice that of the number of banks of the blocks of said error correction code, and which second part of said memory is used for said de-interleaving.

4. Method according to claim 1, wherein said third part of a said memory consists of a third number—e.g. three—of banks.

5. Method for decoding error correction code, e.g. CIRC code, characterized by the steps:

storing a current frame of coded data symbols including error correction bits into a first part of a memory;

writing said current frame of data symbols, thereby delaying part of the data symbols by one data symbol period, into a second part of said memory, these data symbols then representing a C1 code word;

reading said C1 code word from said memory, carrying out on said C1 code word a preliminary C1 decoding including a first preliminary error correction, and writing the preliminarily corrected C1 code word into said second part of said memory;

reading said preliminarily corrected C1 code word from said memory, carrying out on said preliminarily corrected C1 code word a de-interteaving and a preliminary C2 decoding including a second preliminary error correction or a preliminary erasure correction, and writing the resulting preliminarily corrected C2 code word into said second part of said memory;

reading said preliminarily corrected C2 code word from said memory, carrying out on said preliminarily corrected C2 code word together with ones of said error correction bits a further C1 decoding including a first error correction, and writing a further corrected C1 code word into said second part of said memory;

reading said further corrected C1 code word from said memory, carrying out on said further corrected C1 code word a de-interleaving and a further C2 decoding including a second error correction or an erasure correction;

storing the resulting further corrected C2 code word into a third part of said memory;

reading said further corrected code word from said third part of said memory, delaying part of the data symbols representing said further corrected code word by two data symbol periods, and writing the resulting corrected data symbols into said third part of said memory;

outputting the corrected data symbols of the current frame from said third part of said memory.

6. Apparatus for decoding error correction code, e.g. CIRC code, said apparatus including:

an RS decoder;

a memory into a first part of which a current frame of coded data symbols including error correction bits is stored;

a controller controlling the writing of said current frame of data symbols, thereby delaying part of the data symbols by one data symbol period, into a second part of said memory, these data symbols then representing a C1 code word, wherein said controller further controls:

reading said C1 code word from said memory, carrying out in said RS decoder on said C1 code word a C1 decoding including a first error correction, and writing the corrected C1 code word into said second part of said memory;

reading said corrected C1 code word from said memory, carrying out on said corrected C1 code word a de-interleaving and in said RS decoder a C2 decoding including a second error correction or an erasure correction;

storing the resulting corrected C2 code word into a third part of said memory;

reading said corrected C2 code word from said third part of said memory, delaying part of the data symbols representing said corrected C2 code word by two data symbol periods, and writing the resulting corrected data symbols into said third part of said memory;

means for outputting the corrected data symbols of the current frame from said third part of said memory.

7. Apparatus according to claim 6, wherein said first part of a said memory consists of a first number—e.g. three—of banks, into which banks each succeeding frame of data symbols is written in a rotational manner.

8. Apparatus according claim 6, wherein said second part of said memory consists of a second number of banks, which number is twice that of the number of banks of the blocks of said error correction code, and which second part of said memory is used for said de-interleaving.

9. Apparatus according to claim 6, wherein said third part of a said memory consists of a third number—e.g. three—of banks.

10. Apparatus for decoding error correction code, e.g. CIRC code, said apparatus including:

a single RS decoder;

a memory into a first part of which a current frame of coded data symbols including error correction bits is stored;

a controller controlling the writing of said current frame of data symbols, thereby delaying part of the data symbols by one data symbol period, into a second part of said memory, these data symbols then representing a C1 code word, wherein said controller further controls: reading said C1 code word from said memory, carrying out in said RS decoder on said C1 code word a preliminary C1 decoding including a first preliminary error correction, and writing the preliminarily corrected C1 code word into said second part of said memory;

reading said preliminarily corrected C1 code word from said memory, carrying out on said preliminarily corrected C1 code word a de-interleaving and in said RS decoder a preliminary C2 decoding including a second preliminary error correction or a preliminary erasure correction, and writing the resulting preliminarily corrected C2 code word into said second part of said memory;

reading said preliminarily corrected C2 code word from said memory, carrying out in said RS decoder on said preliminarily corrected C2 code word together with ones of said error correction bits a further C1 decoding including a first error correction, and writing the further corrected C1 code word into said second part of said memory;

reading said further corrected C1 code word from said memory, carrying out on said further corrected C1 code word a de-interleaving and in said RS decoder a further C2 decoding including a second error correction or an erasure correction;

storing the resulting corrected C2 code word into a third part of said memory;

reading said corrected C2 code word from said third part of said memory, delaying part of the data symbols representing said corrected C2 code word by two data symbol periods, and writing the resulting corrected data symbols into said third part of said memory;

means for outputting the corrected data symbols of the current frame from said third part of said memory.

* * * * *